United States Patent [19]
McGaha et al.

[11] Patent Number: 5,311,395
[45] Date of Patent: May 10, 1994

[54] SURFACE MOUNT HEAT SINK

[75] Inventors: Jerry A. McGaha, Gainsville; Andrew C. Zeik, Duluth, both of Ga.

[73] Assignee: NCR Corporation, Dayton, Ohio

[21] Appl. No.: 968,923

[22] Filed: Oct. 29, 1992

[51] Int. Cl.5 .............................................. H05K 7/20
[52] U.S. Cl. .................................. 361/720; 165/80.3; 165/185; 174/16.3; 257/707; 257/722; 361/702; 361/709
[58] Field of Search ............................ 165/80.3, 185; 176/16.3; 257/706-707, 718-719, 722; 361/383, 386-389, 400, 403, 417, 419-420

[56]         References Cited
        U.S. PATENT DOCUMENTS

| | | |
|---|---|---|
| 3,213,324 | 10/1965 | McAdam . |
| 3,548,927 | 12/1970 | Spurling . |
| 3,670,215 | 6/1972 | Wilkens et al. ............ 165/80.3 |
| 4,054,901 | 10/1977 | Edwards et al. . |
| 4,203,488 | 5/1980 | Johnson et al. . |
| 4,609,040 | 9/1986 | Moore . |
| 4,710,852 | 12/1987 | Keen . |
| 4,729,426 | 3/1988 | Hinshaw . |
| 4,748,538 | 5/1988 | Tsuji . |
| 4,849,856 | 7/1989 | Funari et al. . |
| 4,890,196 | 12/1989 | Hinshaw . |
| 4,965,651 | 7/1990 | Gohl et al. ............ 361/388 |
| 5,019,942 | 5/1991 | Clemens . |
| 5,022,462 | 6/1991 | Flint et al. . |
| 5,065,279 | 11/1991 | Lazenby et al. ............ 361/388 |
| 5,130,888 | 7/1992 | Moore . |

OTHER PUBLICATIONS

"Heat Sink Assembly For TAB-Mounted Devices" IBM Tech. Dis. Bulletin, vol. 31, No. 6, Nov. 1988 pp. 372-373.

"Surface-Mounted Heat Sink Attach For TAB", IBM Tech. Dis. Bulletin, vol. 31, No. 3B, Aug. 1990, pp. 101-103.

Almquist et al., "Spring-Clip Mounted Extruded Aluminum Heat Sink", May 1981, IBM Technical Disclosure Bulletin, vol. 23, No. 12.

Primary Examiner—Gregory D. Thompson
Attorney, Agent, or Firm—Albert L. Sessler, Jr.

[57]         ABSTRACT

A heat sink for electronic devices which are surface mounted on a printed circuit board includes two side members, a connecting bridge, a foot on each side member which is soldered to a mounting pad on the printed circuit board, a locating element on each side member which engages an aperture in the printed circuit board during assembly, and a group of heat dissipating fingers on each side member. The heat sink can be placed over an electronic device which is surface mounted to the mounting pad on the printed circuit board and the feet of the heat sink can be soldered to the mounting pad simultaneously with the soldering of the electronic device to the mounting pad on the printed circuit board.

10 Claims, 2 Drawing Sheets

5,311,395

SURFACE MOUNT HEAT SINK

BACKGROUND OF THE INVENTION

The present invention relates generally to heat sinks, and more specifically relates to heat sinks designed for use with surface mounted semiconductor components.

Many electronic circuits require the use of heat sinks to properly dissipate the heat generated in certain semiconductor components. Current heat sink designs are generally not compatible with surface mount semiconductors and generally do not lend themselves to automated assembly.

One currently used solution to this problem is to leave a large copper landing on the circuit board in order to dissipate the heat in the semiconductor that is soldered to it. There is a major disadvantage to this approach, in that it requires a large amount of surface area on the circuit board because it is not thermally efficient. In today's increasingly compact electronics packaging, this is often unacceptable.

SUMMARY OF THE INVENTION

The present invention provides a very low cost heat sink that is designed to be used with surface mount semiconductors, can be inserted on a printed circuit board using automated pick-and-place equipment, and allows access to the semiconductor for inspection and repair. Additionally, it occupies relatively little circuit board area while maintaining a low profile, lending it to compact packaging.

In accordance with one embodiment of the present invention, a heat sink for use in dissipating heat from a surface mount electronic device mounted on a printed circuit board comprises a pair of side members; a bridge connected to each side member at one edge thereof; a mounting foot connected to each side member at an opposite edge to the edge to which the bridge is connected and extending at right angles to each side member for conductive engagement with a mounting pad on said printed circuit board; and a locating stake integral with and extending from each of said side members for engagement with an aperture in said printed circuit board.

In accordance with another embodiment of the present invention, an electronic assembly comprises a surface mount printed circuit board having a mounting pad thereon; an electronic device mounted on said circuit board and occupying a portion of said pad; and a heat sink device extending around said electronic device and having two side members, a connecting bridge and having a mounting foot on each side member which engages another portion of said pad, said heat sink device also including a locating element integral with and extending from each of said side members for engagement with an aperture in said printed circuit board.

In accordance with another embodiment of the present invention, a method for providing heat dissipation for a surface mounted electronic device comprises the following steps: (a) providing a printed circuit board having a mounting pad thereon; (b) placing a surface mount electronic device on said mounting pad; (c) providing a heat sink device having two side members, a connecting bridge and a mounting foot connected to each side member; (d) placing said heat sink device over said electronic device with said mounting foot on said mounting pad of the printed circuit board; and (e) soldering said electronic device and each said mounting foot of said heat sink device simultaneously to said mounting pad.

It is accordingly an object of the present invention to provide a heat sink which is suitable for use with surface mounted electronic components.

It is another object of the present invention to provide a heat sink which can be applied to a printed circuit board by automated equipment.

Another object of the present invention is to provide an electronic assembly comprising a printed circuit board, a surface mounted electronic component and a heat sink for the electronic component.

Another object of the present invention is to provide a method for providing heat dissipation for a surface mounted electronic device.

With these and other objects, which will become apparent from the following description, in view, the invention includes certain novel features of construction and combinations of parts, a preferred form or embodiment of which is hereinafter described with reference to the drawings which accompany and form a part of this specification.

DETAILED DESCRIPTION

Figure 1:
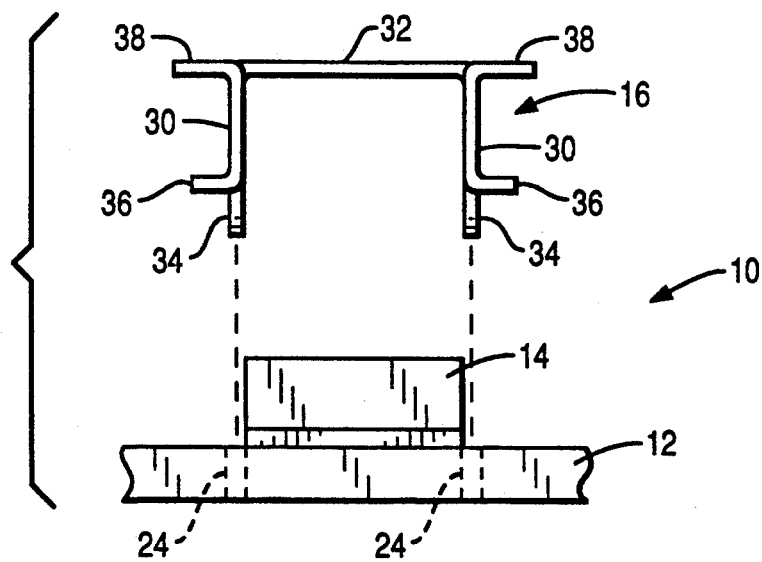
FIG. 1 is a front exploded view of an electronic assembly, showing a printed circuit board, an electronic component surface mounted on the circuit board and a heat sink which can be assembled to the board over the electronic component.
Figure 2:
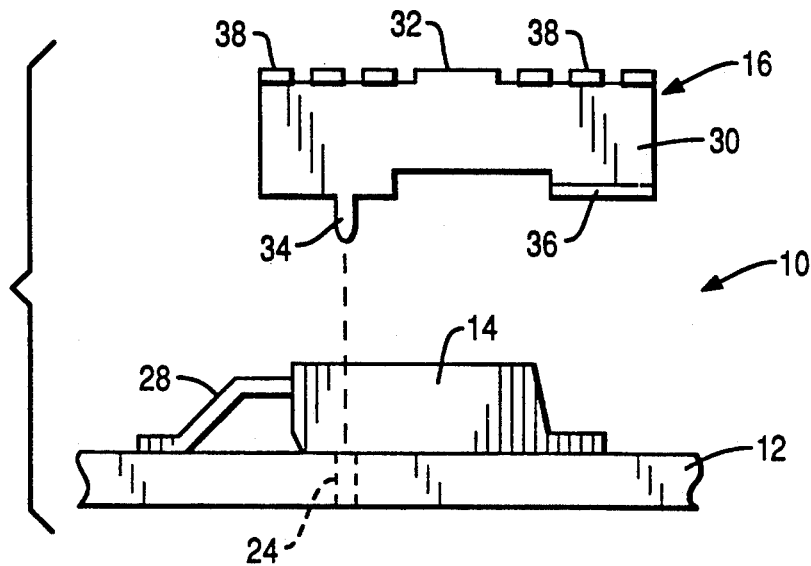
FIG. 2 is a right side elevation view of the assembly of FIG. 1.
Figure 3:
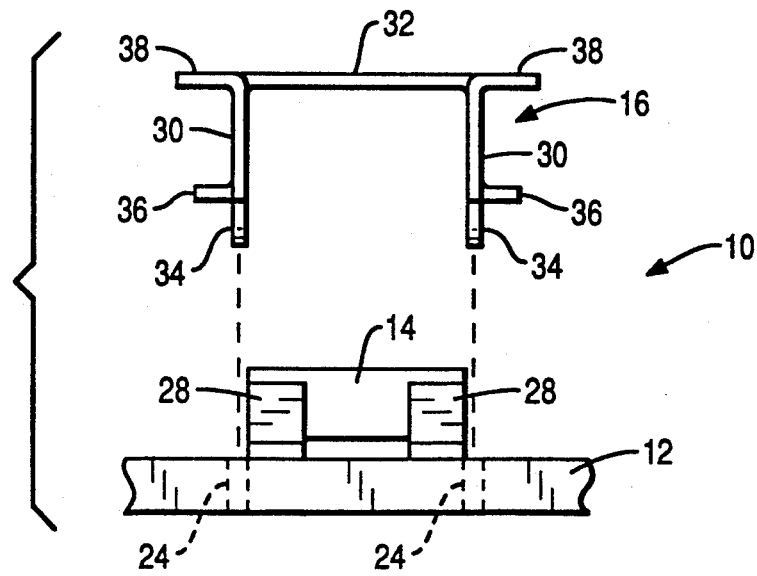
FIG. 3 is a rear view of the assembly of FIG. 1.

Referring now to FIGS. 1, 2 and 3, shown there are front, right side and rear exploded views of a typical embodiment of the invention. In this embodiment, the concept is shown as it applies to the Motorola DPAK surface mount package. The actual configuration of the heat sink forming part of the invention will vary with the particular surface mount device with which it is used.

Figure 4:
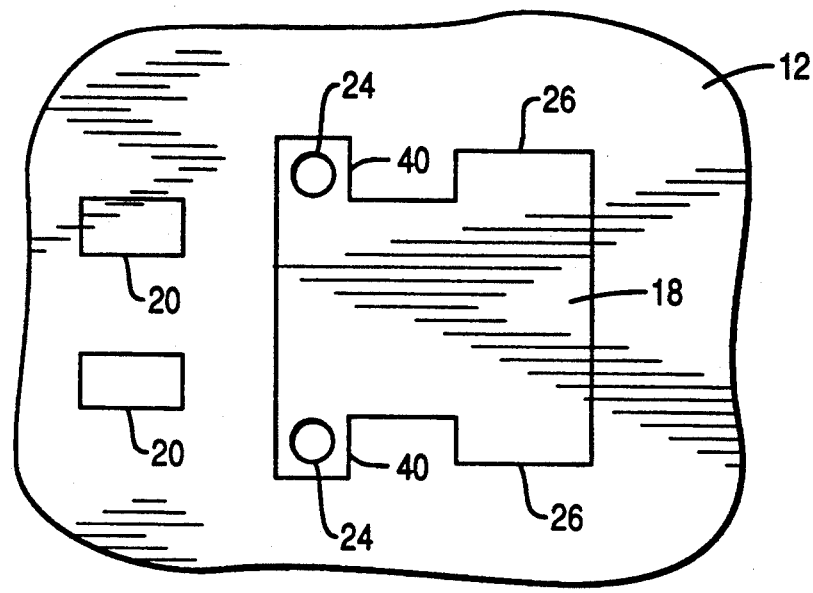
FIG. 4 is a fragmentary plan view of a printed circuit board, showing mounting pads for surface mounting of an electronic component and a heat sink.

As shown in FIGS. 1–3, an electronic assembly 10 comprises a printed circuit board 12, an electronic device 14 and a heat sink 16. As best shown in FIG. 4, the printed circuit board 12 includes on its upper surface a first mounting pad 18 and two smaller mounting pads 20, all of conductive material, adapted for use in surface mount technology, as is well known. Also shown in FIG. 4 are two apertures 24 extending through said board, to receive locating elements on the heat sink 16, as will subsequently be disclosed. In the illustrated embodiment, the electronic device 14 is soldered to the mounting pad 18 and includes two connectors 28 which are soldered to the two smaller mounting pads 20.

Figure 5:
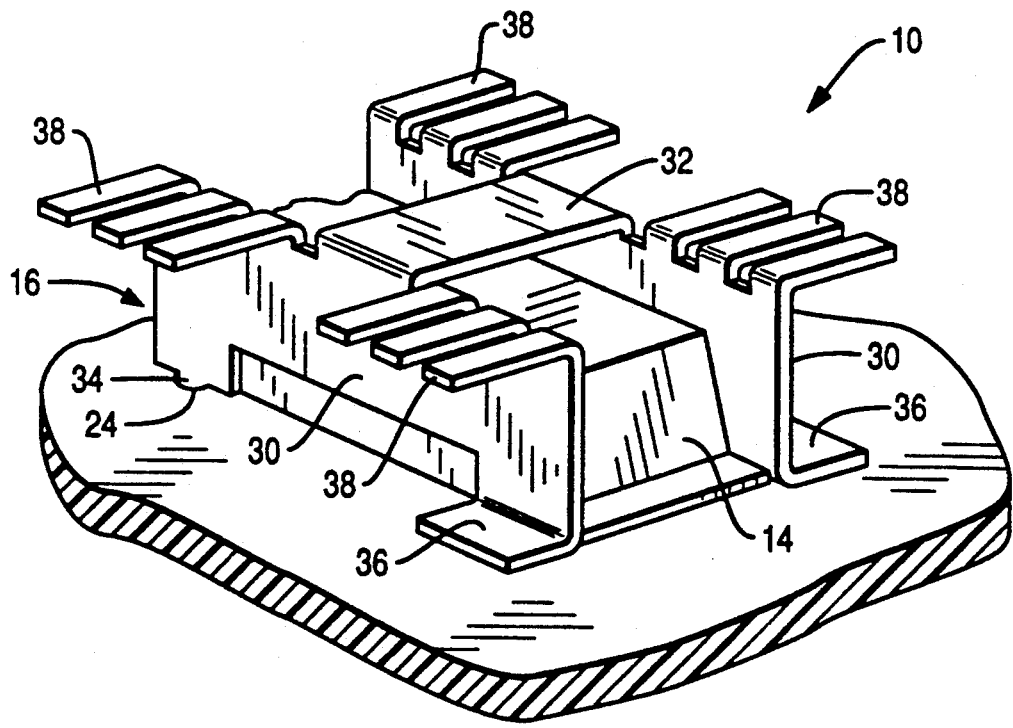
FIG. 5 is a perspective view of an assembly of a printed circuit board, an electronic component and a heat sink.

The heat sink 16 comprises two spaced-apart vertical side members 30, connected by a horizontal bridge 32. A downwardly extending element or stake 34 on each of the side members 30 may optionally be included and provides a locating function for locating the heat sink 16 on the printed circuit board 12 by engaging in the apertures 24 in the board. Two mounting feet 36 are formed integrally with the side members 30 and extend outwardly therefrom at right angles. These feet engage the extended portions 26 of the mounting pad 18 and are soldered thereto when the heat sink is assembled to the circuit board 12. Heat dissipating elements are also provided on the heat sink 16. In the illustrated embodiment, these take the form of sets of fingers 38, with two sets of fingers being provided on each side member 30, one set on each side of the central bridge 32, extending at right angles outwardly from said side member and integral therewith. This is best shown in the perspective view of FIG. 5.

The material from which the heat sink is constructed may vary. Typically, the heat sink is pressed as a single part from a piece of copper or copper alloy. Other suitable materials may also be used.

The heat sink 16 may be packaged for assembly in tape-and-reel form, tube form or tray form, enabling the heat sink to be placed on the printed circuit board 12 by automated equipment. The bridge 32 provides a suitable surface to enable the heat sink to be grasped by the automated equipment. The electronic device can also be placed on the circuit board automatically. In the assembly process, the electronic device 14 is placed on the printed circuit board 12 first, and then the heat sink 16, being of suitable dimensions with respect to the electronic device 14, is placed over the device. Both the electronic device 14 and the heat sink 16 are soldered to the mounting pads simultaneously during a reflow soldering process, and share the printed circuit board mounting pad 18. Heat is conducted away from the electronics device 14 and to the heat sink 16 via the circuit board mounting pad 18. The locating stakes 34, when placed in the apertures 24, are located within two extensions 40 of the mounting pad 18. The apertures 24 may be copper plated and thereby connected to said mounting pad, as best seen in FIG. 4, in order to provide some additional enhancement of thermal conductivity from the mounting pad 18 to the heat sink 16. The locating stakes also provide additional mechanical strength in the connection of the heat sink to the printed circuit board 12.

While the form of the invention shown and described herein is admirably adapted to fulfill the objects primarily stated, it is to be understood that it is not intended to confine the invention to the form or embodiment disclosed herein, for it is susceptible of embodiment in various forms within the scope of the appended claims.

What is claimed is:

1. A heat sink for use in dissipating heat from a surface mount electronic device mounted on a printed circuit board, comprising:
   a pair of side members;
   a bridge connected to each side member at one edge thereof;
   a mounting foot connected to each side member at an opposite edge to the edge to which the bridge is connected and extending at right angles to each said side member for conductive engagement with a mounting pad on said printed circuit board; and
   a locating stake integral with and extending from each of said side members for engagement with an aperture in said printed circuit board.

2. An electronic assembly, comprising:
   a surface mount printed circuit board having a mounting pad thereon;
   an electronic device mounted on said circuit board and occupying a portion of said pad; and
   a heat sink device extending around said electronic device and having two side members, a connecting bridge and having a mounting foot on each side member which engages another portion of said pad, said heat sink device also including a locating element integral with and extending from each of said side members for engagement with an aperture in said printed circuit board.

3. The electronic assembly of claim 2, in which said aperture is plated and connected to said mounting pad.

4. An electronic assembly, comprising:
   a surface mount printed circuit board having a mounting pad thereon;
   an electronic device mounted on said circuit board and occupying a portion of said pad; and
   a heat sink device extending around said electronic device and having two side members, a connecting bridge and having a mounting foot on each side member which engages another portion of said pad, said side members and connecting bridge of the heat sink device being dimensioned to fit over the electronic device mounted on the printed circuit board, and each mounting foot being soldered to the mounting pad of the printed circuit board on one side of the electronic device.

5. A method for providing heat dissipation for a surface mounted electronic device, comprising the following steps:
   (a) providing a printed circuit board having a mounting pad thereon;
   (b) placing a surface mount electronic device on said mounting pad;
   (c) providing a heat sink device having two side members, a connecting bridge and a mounting foot connected to each side member;
   (d) placing said heat sink device over said electronic device with each mounting foot on said mounting pad of the printed circuit board; and
   (e) soldering said electronic device and each said mounting foot of said heat sink device simultaneously to said mounting pad.

6. The method of claim 5, in which the electronic device and the heat sink device are placed on the printed circuit board by automated pick and place equipment.

7. The method of claim 5, in which the printed circuit board includes a pair of apertures adjacent to the mounting pad, the heat sink device includes a locating element connected to each side member, and the step of placing the heat sink device includes placing the locating elements in the apertures.

8. The method of claim 5, in which the heat sink device is packaged for assembly in tape-and-reel form.

9. The method of claim 5, in which the heat sink device is packaged in tube form for assembly.

10. The method of claim 5, in which the heat sink device is packaged in tray form for assembly.

* * * * *